United States Patent [19]

Ewers

[11] Patent Number: 5,175,491
[45] Date of Patent: Dec. 29, 1992

[54] INTEGRATED CIRCUIT TESTING FIXTURE

[75] Inventor: Charles R. Ewers, Phoenix, Ariz.

[73] Assignee: SGS-Thomson Microelectronics, Inc., Carrollton, Tex.

[21] Appl. No.: 761,693

[22] Filed: Sep. 18, 1991

[51] Int. Cl.⁵ ............................................. G01R 31/00
[52] U.S. Cl. ............................. 324/158 F; 324/158 P; 439/91
[58] Field of Search ............ 324/158 R, 158 F, 72.5, 324/73.1; 439/70, 66, 69, 91, 482, 68; 437/8; 174/52

[56] References Cited

U.S. PATENT DOCUMENTS

| | | | |
|---|---|---|---|
| 3,877,064 | 4/1975 | Scheingold et al. | 324/158 F |
| 4,324,040 | 4/1982 | Gottlieb | 324/158 F |
| 4,766,371 | 8/1988 | Moriya | 324/158 F |
| 4,899,107 | 2/1990 | Corbett et al. | 324/158 R |
| 5,086,269 | 2/1992 | Nobi | 324/158 F |

Primary Examiner—Vinh Nguyen
Attorney, Agent, or Firm—Kenneth C. Hill; Lisa K. Jorgenson; Richard K. Robinson

[57] ABSTRACT

A test fixture is provided for simultaneously performing burn-in and testing of multiple integrated circuit devices. The packaged integrated circuits rest on electrical contacts without sockets. A top plate of the fixture holds all of the devices in place. The use of a compressible material allows for variations in package size, lead length, and socket wear while still maintaining good electrical connection. Leads are connected through the test substrate to the backside and the devices may be connected in parallel or otherwise as desired.

6 Claims, 2 Drawing Sheets

INTEGRATED CIRCUIT TESTING FIXTURE

BACKGROUND OF THE INVENTION

1. Field of the Invention

The present invention relates generally to integrated circuits, and more specifically to a fixture for testing integrated circuits.

2. Description of the Prior Art

Integrated circuit testing is an important part of the fabrication process. Testing of completed and packaged integrated circuit devices is relatively costly and time consuming, in part because individual devices must be oriented and placed into a socket on a test fixture.

Burn-in and testing of completed devices is important, however, because many customers demand relatively stringent levels of device functionality. Therefore, although testing is relatively expensive, it is important and necessary. It is worthwhile to decrease the expense for test fixtures and time to perform burn-in and testing of packaged integrated circuit devices.

One type of integrated circuit package, known as a J lead package, is widely used in the industry. This device is placed into sockets for both testing and use. In a test fixture, repeated use of sockets causes them to wear out. Replacement of sockets on test fixtures increases the overall testing cost of packaged devices.

It would be desirable to provide a simple, inexpensive test fixture which allows testing of multiple packaged integrated circuit devices. It would be further desirable for such a test fixture to be useful for testing SOJ packaged devices

SUMMARY OF THE INVENTION

Therefore, according to the present invention, a test fixture is provided for simultaneously performing burn-in and testing of multiple integrated circuit devices. The packaged integrated circuits rest on electrical contacts without sockets. A top plate of the fixture holds all of the devices in place. The use of a compressible material allows for variations in package size, lead length, and socket wear while still maintaining good electrical connection. Leads are connected through the test substrate to the backside and the devices may be connected in parallel or otherwise as desired.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
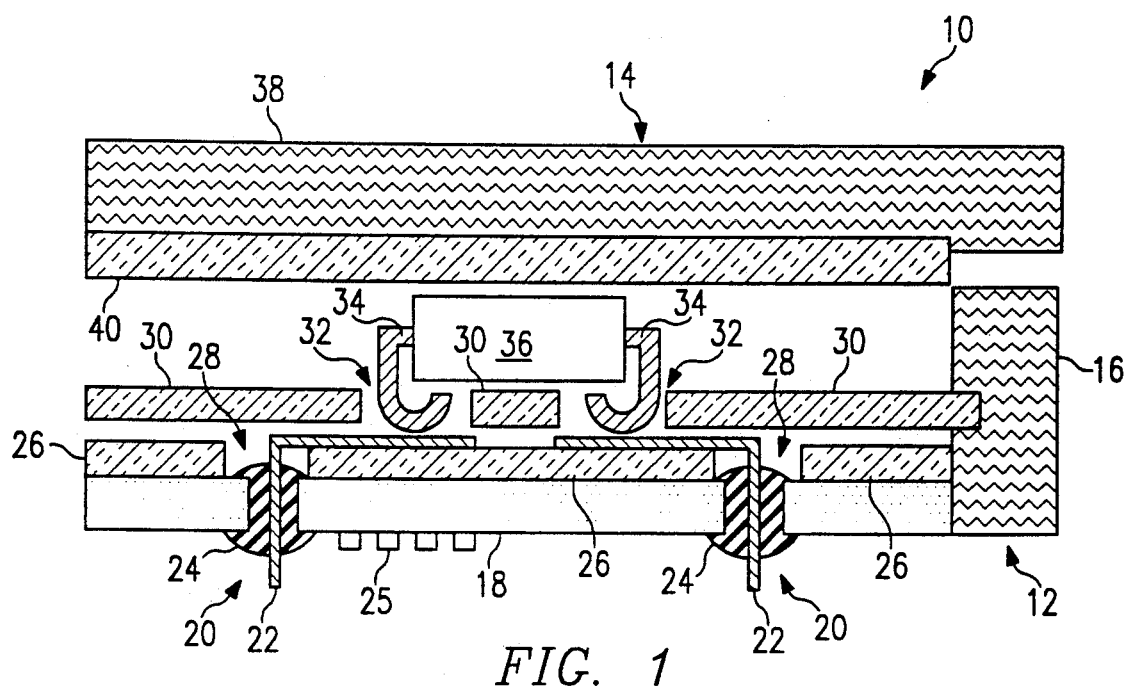
FIG. 1 is a cross-sectional view of a testing fixture according to the present invention.

Referring to FIG. 1 a test fixture, indicated generally by the reference number 10, has a bottom portion 12 and a top portion 14. FIG. 1 shows in cross-section a portion of the test fixture 10, including one sidewall 16 of the bottom portion 12. The bottom portion 12 includes a substrate 18. Substrate 18 can be made of printed circuit board material, such as FR-5.

Substrate 18 has a plurality of holes 20 which extend all the way through the substrate. Conductive leads 22 extend through the holes 20 to the underside, and are held in place by beads of a conductive solder 24. The solder 24, in addition to holding the leads 22 in place, also serves to connect them to conductive traces 25 on the underside of the substrate 18.

On the top side of substrate 18, a flexible layer 26 has holes 28 which line up with the holes 20 in the substrate 18. Flexible layer 26 is firmly attached to the substrate 18, and is made from a compressible material such as elastomeric fluorocarbon. Conductive leads 22 are affixed to the flexible layer 26 using a suitable adhesive. Conductive leads 22 are placed in a pattern which will be described in more detail in connection with FIG. 2.

Spacer layer 30 is disposed over flexible layer 26 and leads 22. In FIG. 1, spacer layer 30 is shown as connected directly to the sidewall 16 and spaced above the conductive leads 22. If desired, the spacer layer 30 can rest directly on the conductive leads.

Spacer layer 30 is formed from a non-conductive, stiff material such as alumina, or punched high temperature paper such as NOMEX. Spacer layer 30 has a plurality of holes 32 which are spaced so as to accept integrated circuit package leads 34 projecting from an integrated circuit package 36. In FIG. 1, the integrated circuit package 36 is an SOJ package having curved J leads 34 as shown, but it will be appreciated by those skilled in the art that the fixture can be designed to accept standard straight leads by changing the spacing of the holes 32 and the thickness of the spacer layer 30.

The top portion 14 is formed from a stiff backing 38 and a compressible pad 40. Stiff backing 38 may be formed from any stiff material, including metals such as aluminum, and compressible pad 40 may be formed from materials such as silicone. If desired, compressible pad 40 may be scored, effectively dividing it into a plurality of separate regions. The scoring is located so that each region overlies one of the integrated circuit packages 36. This prevents variability of package 36 heights from affecting adjacent packages.

As shown in FIG. 1, the top portion 14 is spaced slightly away from the sidewall 16 of the bottom portion 12. When all of the integrated circuits 36 have been positioned, the top portion 14 is pressed down against the sidewall 16, and held in place by any suitable clamping means (not shown). The compressible pad 40 presses on the top of integrated package 36, forcing the leads 34 firmly against the conductive leads 22. Flexible layer 26 under the conductive leads 22 lets the leads 22 "give" so that they make a spring contact with the package leads 34.

The compressibility of both the pad 40 and the flexible layer 26 provides for good electrical contact between the package leads 34 and the conductive leads 22. This is true even though some variations in the size of the integrated circuit package 36 and the length of the leads 34 can occur. The thickness of the spacer layer 30 is chosen so that the integrated circuit package 36 does not rest against the spacer layer 30 until after the package leads 34 have compressed the flexible layer 26 for a significant fraction of its thickness. This fraction of its thickness could be chosen to be, for example, somewhere in the range of 10 percent to 50 percent of the thickness of flexible layer 26, depending upon the materials used and the variability and the physical dimensions of the integrated circuit packages 34 and leads 34.

Figure 2:
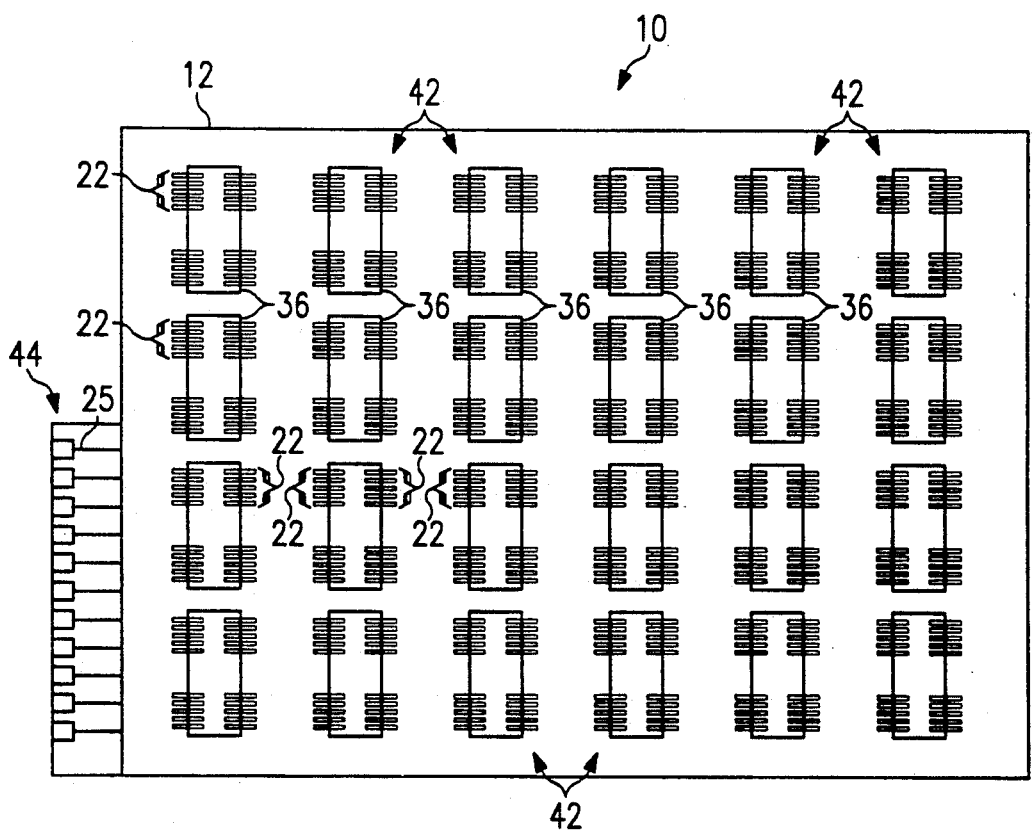
FIG. 2 is a top level plan view illustrating a preferred layout of a test fixture according to the present invention.

Referring to FIG. 2, a top view is shown of a test fixture according to the present invention without the spacer layer 30. The test fixture 10 shown in FIG. 2 has 24 device positions 42, although fixtures having any number of device positions can be constructed in accordance with the present invention. As shown in FIG. 2, the rectangles in each device position 42 represent the shape and position of integrated circuit packages 36 when placed at the device positions 42.

Each position 42 has a plurality of conductive leads 22 which correspond to the leads of the devices. The conductive leads 22 extend downwardly through the bottom portion 12 as shown in connection with FIG. 1. The underside traces 25 on the substrate 18 are preferably brought to one side of the fixture 10 and made available as a plurality of test connection prints. These connections 44 may be used to provide power and test signals to all of the device positions 42 simultaneously. This allows for simultaneous burn-in, and testing if desired, of all of the devices placed into the test fixture 10. If desired, the test connections 42 can be connected so as to allow 24 devices to be burned-in simultaneously, and then tested individually for functionality. Such a more complex use of the fixture may require multi-level signal routing on the backside of the substrate 18 as is well known in the art. Using the single fixture 10 to burn-in and test multiple devices simultaneously helps decreased overall testing costs.

Figure 3:
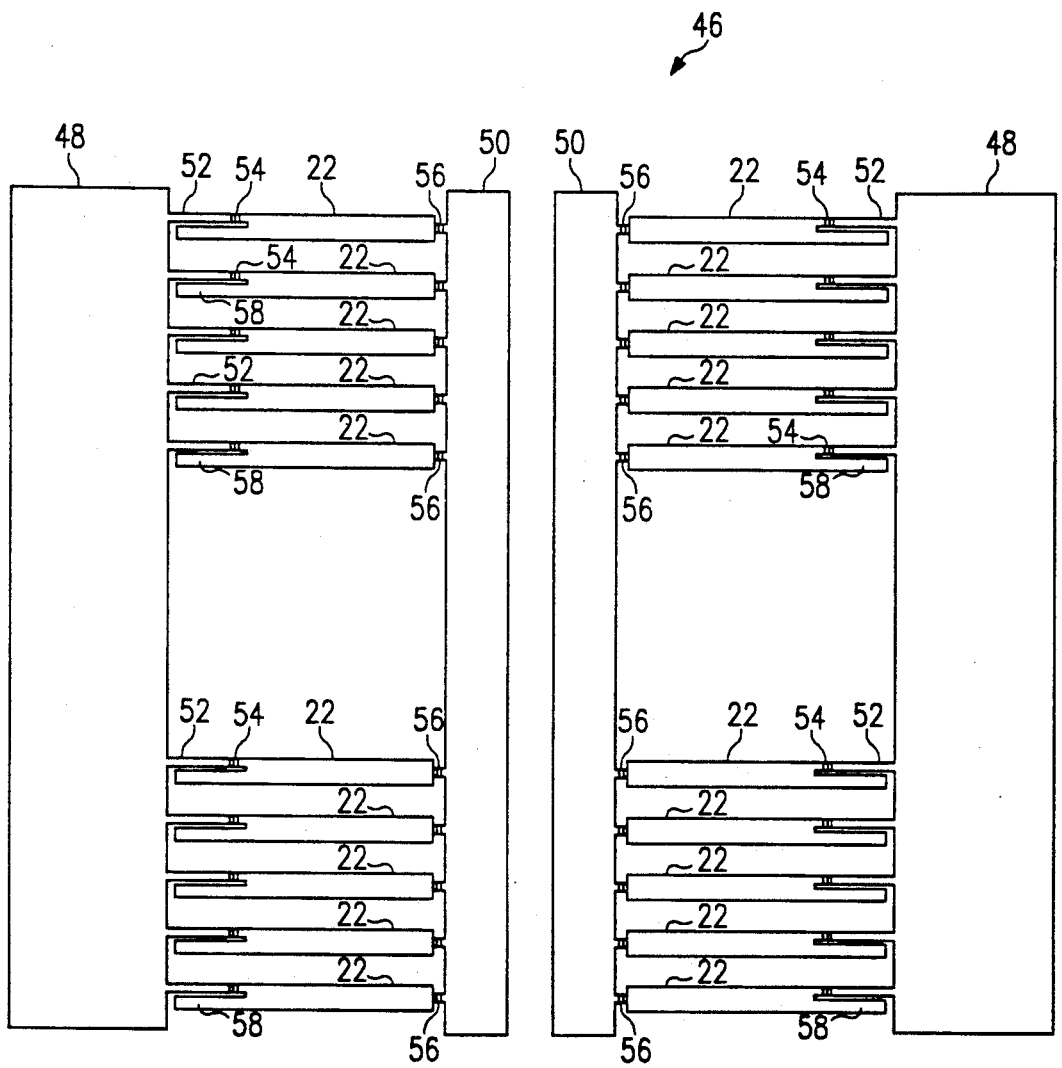
FIG. 3 is a diagram illustrating a preferred lead frame for use with the present invention.

Referring to FIG. 3, a preferred lead frame 46 is illustrated. This lead frame 46 is used to simplify placement of the conductive leads 22 onto the flexible layer 26. FIG. 3 illustrates a 20-lead lead frame, but any desired number of conductive leads 22 can be used with the lead frame.

Each side of the lead frame is identical, having an outer tab 48 and an inner tab 50. Each conductive lead 22 is connected to the outer tab 48 by a tab finger 52 through a scored region 54. Each conductive lead 22 is also connected to the inner tab 50 by a scored region 56. The scored regions 54, 56 are preferably regions which are etched partially through, allowing the lead frame 46 to be easily broken at those regions by moving the tabs 48, 50.

Each conductive lead 22 also contains a lead finger portion 58. To install the conductive leads 22 in a device position 42, each of the lead finger portions 58 are bent down to a 90° angle from the plane of the lead frame 46. The lead finger portions are then inserted through the holes 28 in the flexible layer 26 and holes 20 in the substrate 18. The conductive leads 22 are then affixed to the flexible layer 26 by any suitable adhesive, if desired, and soldered in place as described in connection with FIG. 1. The tabs 48, 50 are then bent upwards, causing the scored regions 54, 56 to break. This physically and electrically separates all of the conductive leads 22 in their proper positions.

Other techniques may be used to place the conductive leads 22, but the use of the lead frame 46 provides a simple, inexpensive technique. The lead frame 46 can be formed using chemical milling or any other technique such as is known in forming integrated circuit devices and sockets for them. Since the spring action for the test fixture, which allows the conductive leads 22 to make good electrical contact to the integrated circuit package leads 34, is caused by compressibility of layers 26 and 40, the conductive leads 22 themselves receive only minimum wear and will not have to be replaced often.

The test fixture described above provides a simple, inexpensive fixture for performing burn-in and test of multiple integrated circuit devices. Since the signals sent to each of the devices are connected through test connections 44, different devices can be tested using the same test fixture. If the devices are electrically connected in parallel, only one device type at a time may be completely burned-in and tested in the fixture at one time. If desired, the openings 32 in the spacer layer 3 may be elongated, so that different devices having different widths may be tested in a single tester. This allows the test fixture 10 to be used as a universal test fixture for any integrated circuit device which has no more package leads than are provided for each device position 42. Packages having a lesser number of leads can be easily accommodated by positioning them at one end of each test position, and appropriately connecting power and signals to the test connections 44.

While the invention has been particularly shown and described with reference to a preferred embodiment, it will be understood by those skilled in the art that various changes in form and detail may be made therein without departing from the spirit and scope of the invention.

What is claimed is:

1. An integrated circuit test fixture, comprising:
   a substrate;
   a compressible pad layer on said substrate;
   a plurality of conductive test leads on said pad layer, wherein said leads are bent to extend through holes in said pad and said substrate;
   a non-conductive spacer over said pad layer, said spacer having a plurality of openings to accept each lead of an integrated circuit; and
   a fixture cover, said cover spaced to press leads of integrated circuit devices against the test leads when said cover is closed.

2. The test fixture of claim 1, wherein said test leads define a plurality of possible device positions suitable for receiving a plurality of integrated circuit devices.

3. The test fixture of claim 2, wherein the spacer openings are aligned with said test leads.

4. The test fixture of claim 1, further comprising:
   a plurality of conductive traces on said substrate connected to said test leads to provide electrical power and signals to integrated circuit devices.

5. The test fixture of claim 4, further comprising:
   a plurality of connections connected to said conductive traces for contacting electrical power and signal sources.

6. The test fixture of claim 1, wherein the openings in said spacer are adapted to accept J-leads.

* * * * *